United States Patent [19]

Sato

[11] Patent Number: 5,734,280

[45] Date of Patent: Mar. 31, 1998

[54] SEMICONDUCTOR INTEGRATED CIRCUIT DEVICE HAVING POWER ON RESET CIRCUIT

[75] Inventor: Hirotoshi Sato, Tokyo, Japan

[73] Assignee: Mitsubishi Denki Kabushiki Kaisha, Tokyo, Japan

[21] Appl. No.: 683,637

[22] Filed: Jul. 15, 1996

[30] Foreign Application Priority Data

Jan. 8, 1996 [JP] Japan .................... 8-000710

[51] Int. Cl.⁶ .................. H03K 17/22; H03K 23/40
[52] U.S. Cl. .................. 327/143; 327/142; 327/146; 327/198
[58] Field of Search .................. 327/142, 143, 327/146, 198, 399; 326/52, 55

[56] References Cited

U.S. PATENT DOCUMENTS

| | | | |
|---|---|---|---|
| 3,745,380 | 7/1973 | Kitajima et al. | 327/142 |
| 4,746,822 | 5/1988 | Mahoney | 327/143 |
| 5,467,039 | 11/1995 | Bae | 327/143 |

FOREIGN PATENT DOCUMENTS

| | | | |
|---|---|---|---|
| 63-94714 | 4/1988 | Japan | H03K 17/22 |
| 1-132213 | 5/1989 | Japan | H03K 17/22 |
| 3165618 | 7/1991 | Japan | H03K 3/02 |
| 4-347925 | 12/1992 | Japan | H03K 17/22 |

Primary Examiner—Timothy P. Callahan
Assistant Examiner—An T. Luu
Attorney, Agent, or Firm—Lowe, Price, LeBlanc & Becker

[57] ABSTRACT

A semiconductor integrated circuit device has an internal circuit node reset signal generation circuit for inverting an output signal with a predetermined time lag immediately after application of power. The internal circuit node reset generation circuit comprises an initial stage power on reset signal generation circuit, an initial stage signal transmission circuit for inputting a signal outputted by the initial stage power on reset signal generation circuit, a final stage power on reset signal generation circuit for inputting a signal outputted by the initial stage signal transmission circuit, and a final stage signal transmission circuit for inputting a signal outputted by the power on reset signal and outputting the output signal. When an operating source voltage lower limit value of the initial stage power on reset signal generation circuit is lower than that of the final stage signal transmission circuit and a source voltage has not reached a predetermined value, it is possible for the final stage power on reset signal generation circuit to generate an output signal without being influenced by the initial stage power on reset signal generation circuit, and to output an internal circuit inactivation signal for a certain time after application of power, and an inversion signal after passing the certain time. As a result, a certain internal circuit initialization time may be exactly established.

8 Claims, 10 Drawing Sheets

SEMICONDUCTOR INTEGRATED CIRCUIT DEVICE HAVING POWER ON RESET CIRCUIT

FIELD OF THE INVENTION

The present invention relates to an internal circuit node reset signal generation circuit (hereinafter referred to as POR (Power On Reset)) which is formed in a control system signal generation circuit of a semiconductor integrated circuit device such as a DRAM, SRAM, microprocessor, controller circuit, etc., for the purpose of preventing erroneous operation of an internal circuit incorporated in the semiconductor integrated circuit device. At the time of applying a power, the internal circuit is kept inactive until rise of source voltage to a predetermined value at which time the internal circuit is activated.

BACKGROUND ART

In a conventional semiconductor integrated circuit device, a POR circuit is usually disposed for the purpose of preventing the internal circuit from operating erroneously at the time of applying power. This POR circuit serves as a circuit for keeping the internal circuit inactive until rise of a source voltage to a predetermined value at which time the internal circuit is activated. FIG. 14 shows a specific arrangement of a conventional POR circuit.

in FIG. 14, 101 is GND (grounding potential point), and 102 is a source potential point, respectively. 103 is an N-channel MOS transistor (hereinafter referred to as NMOS transistor) in which the gate electrode and one source/drain electrode are connected to GND 101 and another source/drain electrode is connected to a node 111. 104 is a NMOS transistor in which the gate electrode and one source/drain electrode are connected to the node 111, and another source/drain electrode is connected to node 112. 105 is a NMOS transistor in which the gate electrode and one source/drain electrode are connected to the node 112, and another source/drain electrode is connected to the source potential point 102. 113 is a capacitor formed between GND and the node 112, and 107, 108 are a P-channel MOS transistor (hereinafter referred to as PMOS transistor) and a NMOS transistor, respectively. One source/drain electrode of the PMOS transistor 107, is connected to the source potential point 102 and another source/drain electrode is connected to the node 114. One source/drain electrode of the NMOS transistor 108 is connected to the node 114 and another source/drain electrode is connected to GND 101. The gate electrodes of PMOS transistor 107 and NMOS transistor 108 are commonly connected to the node 112.

Further, 116 is an inverter circuit comprised of the PMOS transistor 107 and the NMOS transistor 108. 117 is an inverter circuit connected to the node 114 and comprised of a PMOS transistor 110 and a NMOS transistor 109 arranged in the same manner as the inverter circuit 116, and 115 is a node for outputting an output signal of the inverter circuit 117 to a next step circuit. 106 is a PMOS transistor in which the gate electrode receives a potential of the node 115, and source/drain electrodes are respectively connected to the node 112 and the source potential point 102. 118 is a capacitor in which one electrode receives a potential of an outside signal inputted through a ring oscillator (not shown and the opposing electrode receives a potential of the node 111.

In this conventional circuit, when the power source is off, the nodes 111, 112, 114 and 115 are all at GND level and all devices in the circuit remain in an inactive state. When power is applied, the node 112 keeps the GND level for a while due to capacitance coupling of the capacitor 113. As time passes, the node 112 is charged by the signal received at a the node 119 from the ring oscillator. When potential of the node 112 exceeds a threshold value of the inverter 116, a POR signal is generated to the node 115 via inverter 117.

A series of circuit operations mentioned above is now described with reference to FIG. 15 in which the ordinate axis indicates voltage and the abscissa axis indicates time. As shown in FIG. 15, the source voltage value begins to increase exponentially immediately after the application of power and comes to a stable state with the passage of a certain time. The node 112 receives a signal transmitted from the ring oscillator to the node 119 and is charged as time passes. Thus, the voltage value of the node 112 linearly increases. When the node 112 is further charged and the voltage value comes to exceed a threshold value of the inverter 116 of the next stage, the inverter output is inverted whereby a POR signal is generated to the node 115 via inverter 117.

In the conventional POR circuit, a problem exists in that the POR circuit is required to receive an outside signal and accordingly, additional circuits-are required in addition to the arrangement of the POR circuit, e.g., a circuit for generating such an outside signal, a further circuit for stabilizing the voltage thereof, etc. Moreover, in the conventional POR circuit, when employing a power source having a very fast rise time, e.g., on the order of several nsec, or a very slow rise time, e.g., on the order of several sec, no matter how the POR circuit is disposed, another problem exists in that different initialization results are obtained depending upon the rise time of the power source employed which makes it difficult to perform exact initialization.

SUMMARY OF THE INVENTION

The present invention solves the above-discussed problems and has an object of providing a semiconductor integrated circuit device provided with a POR circuit for inverting an output signal with a predetermined time delay immediately after application of power.

A semiconductor integrated circuit device in accordance with one aspect of the invention comprises an internal circuit node reset signal generation circuit for inverting an output signal with a predetermined time lag immediately after application of power.

A semiconductor integrated circuit device in accordance with another aspect of the invention comprises an internal circuit node reset signal generation circuit for inverting an output signal with a predetermined time lag immediately after application of power, and in which the internal circuit node reset signal generation circuit comprises an initial stage power on reset signal generation circuit, a final stage power on reset signal generation circuit, an initial stage signal transmission circuit, and a final stage signal transmission circuit.

An internal circuit node reset signal generation circuit of a semiconductor integrated circuit device in accordance with another aspect of the invention comprises an initial stage power on reset signal generation circuit, a final stage power on reset signal generation circuit, an initial stage signal transmission circuit, and a final stage signal transmission circuit, wherein an operating voltage lower limit value of the initial stage signal transmission circuit is higher than that of the final stage signal transmission circuit.

An internal circuit node reset signal generation circuit of a semiconductor integrated circuit device in accordance with another aspect of the invention comprises an initial stage power on reset signal generation circuit, an initial stage signal transmission circuit for inputting a signal outputted by the initial stage power on reset signal generation circuit, a final stage power on reset signal generation circuit for inputting a signal outputted by the initial stage signal transmission circuit, and a final stage signal transmission circuit for inputting a signal outputted by said power on reset signal and outputting an output signal, and wherein an operating voltage lower limit value of the initial stage power on reset signal generation circuit is lower than that of the initial stage signal transmission circuit.

An internal circuit node reset signal generation circuit of a semiconductor integrated circuit device in accordance with still another aspect of the invention comprises an initial stage power on reset signal generation circuit, an initial stage signal transmission circuit for inputting a signal outputted by the initial stage power on reset signal generation circuit, a final stage power on reset signal generation circuit for inputting a signal outputted by the initial stage signal transmission circuit, and a final stage signal transmission circuit for inputting a signal outputted by the final stage power on reset signal and outputting an output signal, and wherein the final stage power on reset signal generation circuit keeps an initial voltage value and, immediately after application of power, the initial voltage value is transmitted to the final stage signal transmission circuit.

An internal circuit node reset signal generation circuit of a semiconductor integrated circuit device in accordance with a further aspect of the invention comprises an initial stage power on reset signal generation circuit, an initial stage signal transmission circuit for inputting a signal outputted by the initial stage power on reset signal generation circuit, a final stage power on reset signal generation circuit for inputting a signal outputted by the initial stage signal transmission circuit, and a final stage signal transmission circuit for inputting a signal outputted by the final stage power on reset signal generation circuit and outputting an output signal, and wherein, when a source voltage value has not reached a certain value immediately after application of power, the final stage signal transmission circuit is operated, the initial stage signal transmission circuit is not operated, and the final stage power on reset signal generation circuit is operated without being influenced by the initial stage power on reset signal generation circuit, and when the source voltage value exceeds the predetermined value, the output signal of the initial stage power on reset signal generation circuit is transmitted to the final stage power on reset signal generation circuit.

An internal circuit node reset signal generation circuit of a semiconductor integrated circuit device in accordance with a still further aspect of the invention comprises an initial stage power on reset signal generation circuit, an initial stage signal transmission circuit for inputting a signal outputted by the initial stage power on reset signal generation circuit, a final stage power on reset signal generation circuit for inputting a signal outputted by the initial stage signal transmission circuit, and a final stage signal transmission circuit for inputting a signal outputted by the final stage power on reset signal and outputting an output signal, and wherein an inversion potential deciding part of the initial stage power reset on signal generation circuit is comprised of a PMOS transistor, a NMOS transistor, a bipolar transistor or a resistor element.

A semiconductor integrated circuit device in accordance with the invention comprises: an internal circuit node reset signal generation circuit including an initial stage power on reset signal generation circuit for inverting an output signal with a predetermined time lag immediately after application of power, an initial stage signal transmission circuit for inputting a signal outputted by the initial stage power on reset signal generation circuit, a final stage power on reset signal generation circuit for inputting a signal outputted by the initial stage signal transmission circuit, a final stage signal transmission circuit for inputting a signal outputted by the final stage power on reset signal and outputting an output signal, and a feedback circuit for inputting a complementary signal from the final stage signal transmission circuit and outputting a signal which is an exclusive OR function of the input signals to the initial stage signal transmission circuit.

A semiconductor integrated circuit device in accordance with another aspect of the invention comprises a delay circuit connected between the feedback circuit and the internal circuit node reset signal generation circuit.

A semiconductor integrated circuit device in accordance with still another aspect of the invention has an internal circuit node reset signal generation circuit for inverting an output signal with a predetermined time lag immediately after application of power, the internal circuit node reset signal generation circuit includes a power on reset signal generation circuit, a signal transmission circuit, and a normal operation detecting circuit for outputting an activation signal according to normal operation of the signal transmission circuit and delivering the activation signal to the power on reset signal generation circuit.

A semiconductor integrated circuit device in accordance with a still further aspect of the invention comprises a delay circuit connected between the normal operation detecting circuit and the internal circuit node reset signal generation circuit.

Other objects and features of the invention will become understood from the following description with reference to the accompanying drawings.

DETAILED DESCRIPTION OF THE PREFERRED EMBODIMENTS

Figure 1:
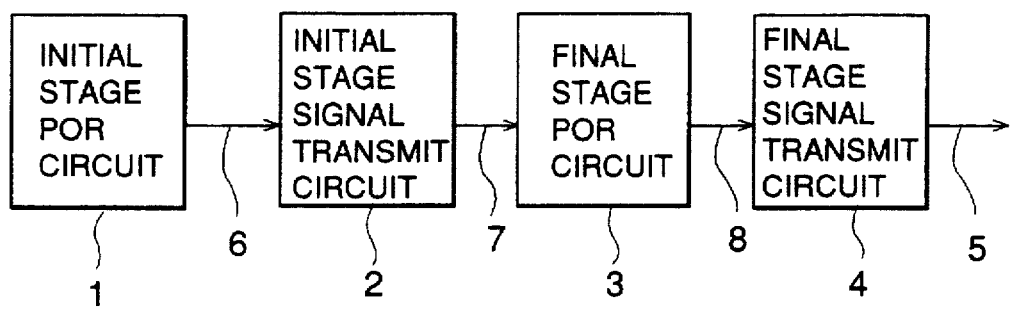
FIG. 1 is a block diagram showing a first embodiment of the present invention.

A first embodiment of the invention is hereinafter described with reference to the drawings. The circuit shown in FIG. 1 is comprised of four circuit blocks. 1 is an initial stage power on reset signal generation circuit, 2 is an initial stage signal transmission circuit for inputting a signal outputted by the initial stage power on reset signal generation circuit 1, 3 is a final stage power on reset signal generation circuit for inputting a signal outputted by the initial stage signal transmission circuit 2, and 4 is a final stage signal transmission circuit for inputting a signal outputted by the final stage power on reset signal generation circuit and outputting an output signal 5. The initial stage power on reset signal generation circuit 1 and the initial stage signal transmission circuit 2 are connected through a node 6. In the same manner, the initial stage signal transmission circuit 2 and the final stage power on reset signal generation circuit 3 are connected through a node 7, and the final stage power on reset signal generation circuit 3 and the final stage signal transmission circuit 4 are connected through a node 8, respectively.

A lower limit of the operating voltage of the initial stage signal transmission circuit 2 is established to be higher than that of the final stage signal transmission circuit 4. Further, the final stage power on reset signal generation circuit 3, not being influenced by the operation of the initial stage power on reset signal generation circuit 1, first keeps an initial voltage value and transmits an output signal thereof to the final stage signal transmission circuit 4 when power is applied.

If the source voltage value reaches a lower limit value of the operating voltage of the final stage signal transmission circuit 4 before the source voltage value reaches a stable potential immediately after application of power, then the final stage signal transmission circuit 4 starts its operation. However, the initial stage signal transmission circuit 2 does not start its operation at such a source voltage value and, accordingly, it is possible for the final stage power on reset signal generation circuit 3 to generate an output signal without being influenced by the preceding stage circuit.

When the source voltage comes near the lower limit value of the operating voltage of the final stage signal transmission circuit 4 and reaches the operating voltage lower limit value of the initial stage signal transmission circuit 2, the initial stage signal transmission circuit 2 starts its operation and begins to transmit the signal of the initial stage power on reset signal generation circuit 1 to the final stage power on reset signal generation circuit 3.

Accordingly, since the output signal is inverted, with a time lag, for a certain period after application of power, an internal circuit inactivation signal may be generated immediately after the application of power and an activation signal may be generated after a certain period.

As a result, in the operation of the semiconductor integrated circuit device after application of power, a certain initialization time may be secured without depending upon the rise time of the power source, whereby it becomes possible to perform exact initialization.

Further, since the initial stage power on reset signal generation circuit 1 may provide a signal which is complementary to the source voltage even at a low source voltage, the lower limit of the operation voltage of the semiconductor integrated circuit is low, whereby a device of superior controllability and less power consumption may be obtained.

Furthermore, since there is no need to input any outside signal to the POR circuit in accordance with the invention, neither a circuit for generating the outside signal nor a circuit for stabilizing the outside signal are required which means that the POR circuit may be arranged employing less components and elements. Consequently any erroneous operation of the POR circuit due to fluctuation of the outside signal may be restrained and, as a result, a semiconductor integrated circuit device having a stable characteristic may be obtained.

Figure 2:
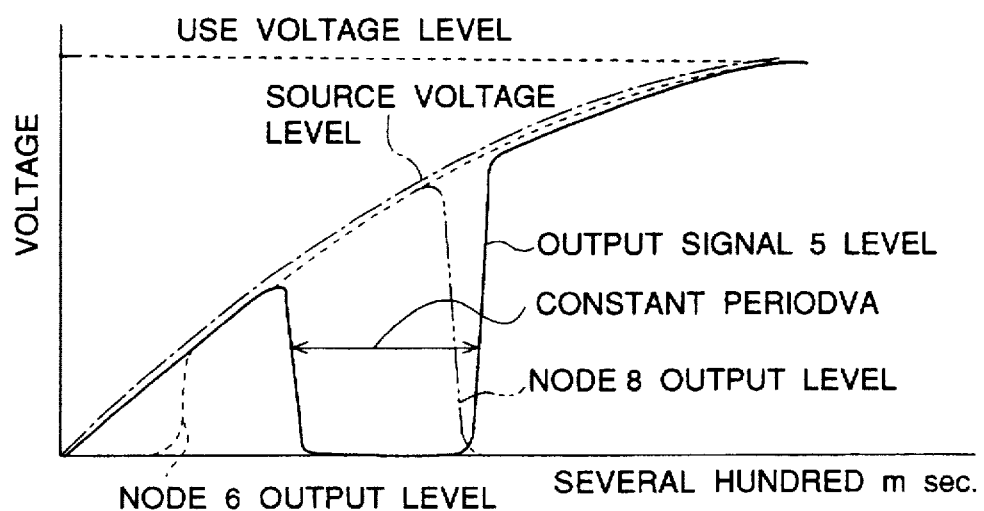
FIG. 2 is a wave form diagram of the first embodiment the invention.

FIG. 2 shows changes in source voltage value, potential of the output signal 5, and voltage of the respective nodes 6, 8 with the passage of time after application of power in the POR circuit. In the drawing, the ordinate axis indicates potential and the abscissa axis indicates time, respectively, with the moment of application of power as the origin.

After application of power, the source voltage value exponentially increases, reaching a working voltage level after about several hundreds msec, and comes to a stable potential state. At the time of such an operation, the output of the initial stage power on reset signal generation circuit 1, i.e., signal of the node 6, remains at a low level. When the applied source voltage exceeds an established potential, the potential of the node 6, disposed between the initial stage power on reset signal generation circuit 1 and the initial stage signal transmission circuit 2, begins to rise and rises, instantaneously, up to a potential equal to the source voltage value. Subsequently, the potential of the node 6 rises according to the rise of the source voltage value and reaches a stable working voltage level in the same manner as the source voltage value. After the application of power, the initial stage signal transmission circuit 2 does not operate until the rise of the potential of the node 6 and therefore, the final stage power on reset signal generation circuit 3 operates without influence of the output signal from the initial stage power on reset signal generation circuit 1.

Potential of the node 8, to which output signal of the final stage power on rest signal generation circuit 3 is transmitted, first rises exponentially after the application of power in the same manner as the source voltage value, then falls sharply to GND level before the source voltage value reaches the working voltage level, and the falles potential is held. Potential of the output signal 5 first exponentially rises according to the rise of the source potential due to capacitive coupling after the application of power, and when the final stage signal transmission circuit 4 begins to operate normally while potential of the node 8 has a potential equal to the source voltage value, the potential of the output signal 5 falls sharply to GND level. The potential is kept at GND level during the time (indicated by a period A) before the potential of the node 8 falls. Thereafter, at the time the potential of the node 8 falls, the potential of the output signal rises sharply, due to the mentioned change, up to a potential equal to that of the source voltage value, maintains a value equal to the source potential, and stabilizes at the working voltage level.

As described above, in the device provided with a POR circuit in accordance with this example, since an internal activation signal may be generated after the initialization time of a certain period A, freely established, it is possible to carry out initialization exactly irrespective of the rise time of the power source employed. Since there is no need to use any outside signal, the arrangement of the circuit may be simplified, and a device having a stable characteristic may be achieved.

Figure 3:
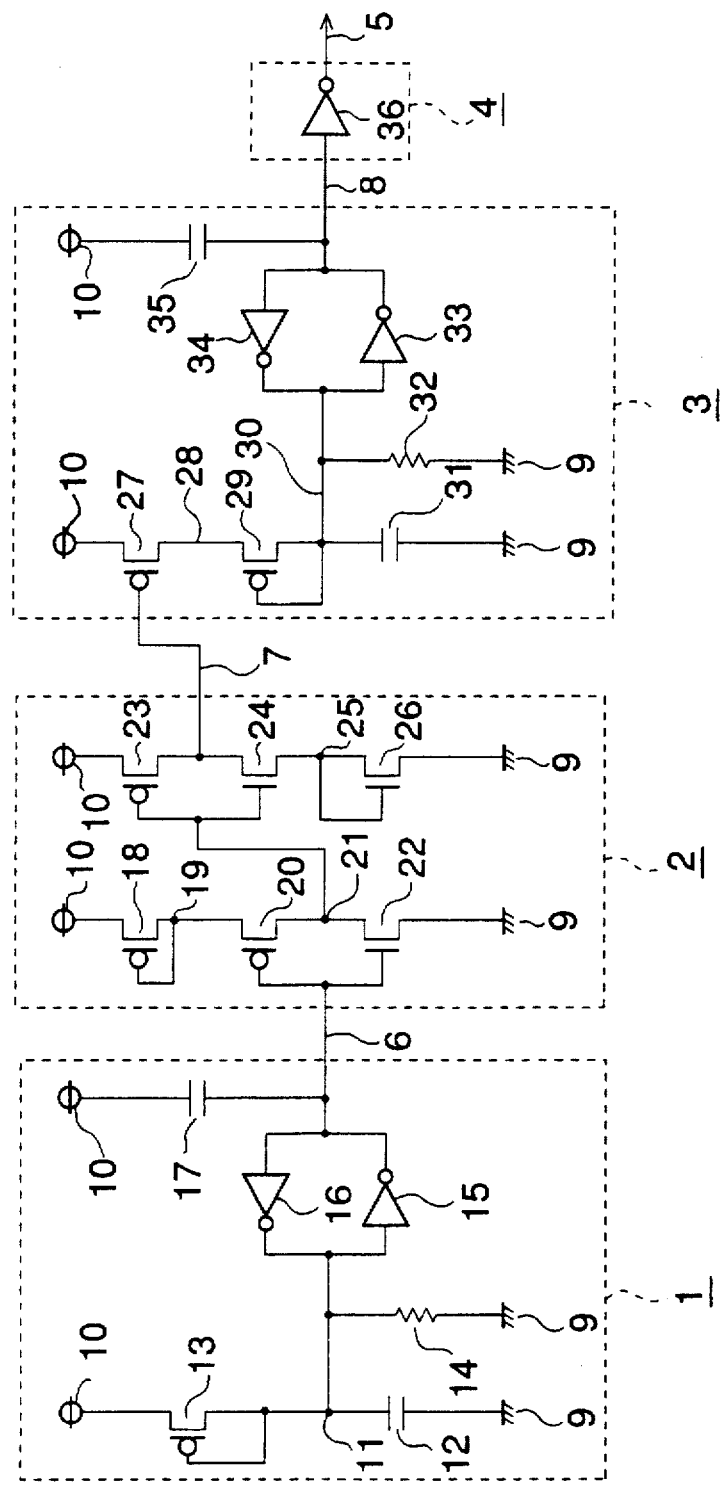
FIG. 3 is a circuit diagram the first embodiment of the invention.

FIG. 3 is a circuit diagram showing a specific arrangement of the POR circuit of the first embodiment.

As shown in FIG. 3, the POR circuit comprises four block circuits 1, 2, 3 and 4, in the same manner as in FIG. 1. In the initial stage power on reset signal generation circuit 1, a capacitor 12, a node 11 and a PMOS transistor 13 are formed between GND 9 and a source potential 10. One electrode of the capacitor 12 receives a potential of GND 9, another electrode receives a potential of the node 11, a source electrode of the PMOS transistor 13 receives a potential of the source potential 10, and gate electrode receives a potential of the node 11. A resistor 14 is disposed between the node 11 and GND 9. An inverter latch circuit formed of inverter circuit 15 and another inverter circuit 16 connected in parallel with the inverter circuit 15, in a reverse direction, is connected to the node 11. A capacitor 17 is formed between the node 6, to which the output of the inverter latch circuit is transmitted, and the source potential point 10.

Now, the initial stage signal transmission circuit 2 is described. The initial stage signal transmission circuit 2 comprises a PMOS transistor 18, a PMOS transistor 20, a NMOS transistor 22, a PMOS transistor 23, a NMOS transistor 24 and a NMOS transistor 26. The PMOS transistor 18 is connected between the source potential point 10 and GND 9, and has one source/drain electrode connected to the source potential 10 and another source/drain electrode 19 connected to the gate electrode. The PMOS transistor 20 has the potential of the node 6 received by the gate electrode, and one source/drain electrode is connected to the other source/drain electrode 19 of the PMOS transistor 18. The NMOS transistor 22 is connected between another source/drain electrode 21 of the PMOS transistor 20 and GND 9, and potential of the node 6 is received by the gate electrode. The PMOS transistor 23, receives the potential of the source/drain electrode 21, common to the PMOS transistor 20 and N-channel MOS transistor 22, at the gate electrode, and one source electrode is connected to the source voltage 10. The NMOS transistor 24 receives the potential of the source/drain electrode 21 at the gate electrode, and one source/drain electrode is connected to one source/drain electrode of the PMOS transistor 23 through the node 7. The NMOS transistor 26 has one source/drain electrode connected to another source/drain electrode of the NMOS transistor 24 via the node 25, GND 9 connected to another source/drain electrode, and potential of the node 25 applied to the gate electrode. Potential of the node 7 is transmitted to the final stage signal transmission circuit 3.

The final stage signal transmission circuit 3 comprises a PMOS transistor 27, a PMOS transistor 29, a capacitor 31, a resistor 32, an inverter 33, an inverter 34, and a capacitor 35. The PMOS transistor 27 has the signal of the node 7 applied to the gate electrode, and one source/drain electrode connected to the source potential 10 through a node 28. The PMOS transistor 29 has one source/drain electrode connected to another source/drain electrode of the PMOS transistor 27, and the potential applied to another source/drain electrode, via the node 30, is applied also to the gate electrode. The capacitor 31 is formed between the other source/drain electrode and GND 9. The resistor 32 is disposed between the node 30 and the GND 9. An inverter latch comprised of inverter 33 and 34 inverts the potential of the node 30 and transmits an output signal to the node 8. The capacitor 35 is formed between the node 8 and source potential 10 for transmitting the output signal of the inverter 33 to the final stage signal transmission circuit 4.

The final stage signal transmission circuit 4 to which the output signal of the final stage power on reset signal generation circuit 3 is transmitted through the node 8, comprises an inverter 36 for inverting the output of the node 8. The output of the inverter 36 is transmitted as the output signal 5 of the POR circuit to a control system signal generation circuit of the semiconductor integrated circuit device such as a DRAM, SRAM, microprocessor, controller, etc., formed at a next stage.

In the initial stage power on reset signal generation circuit 1 described above, the node 11 remains at a low level immediately after application of power because of the capacitor 12 interposed between the node 11 and GND 9. However, as the source voltage value increases, a voltage above a threshold value is applied between the source/drain electrodes of diode connected PMOS transistor 13, increasing the voltage of the node 11. When the voltage value at the node 11 exceeds the threshold value of the inverter 15, the voltage level is inverted, whereby potential of the node 6 falls to a low level.

In the initial stage signal transmission circuit 2 to which the potential from the node 6 is transmitted, because there are numerous devices connected, voltage for normal operation is established to be higher than that in the circuits 1, 3 and 4 when the source voltage is applied. Accordingly, at the moment when the voltage level of the node 6 of the initial stage signal transmission circuit 2 is inverted, the initial stage signal transmission circuit 2 does not operate, and the potential of the node 7, transmitting the output signal of the initial stage signal transmission circuit 2, remains at a high level state.

In the final stage power on reset signal generation circuit 3 to which the potential from the node 7 is transmitted, the node 30 remains at a low level immediately after application of power. Then, the moment when the final stage signal transmission circuit 2 begins normal operation, the node 7, receiving a signal from the initial stage power on reset signal generation circuit 1, falls to a low level while the node 30 rises to a high level. As a result, an activation signal is transmitted to the next stages. In this operation, because the source voltage value for normal operation of the final stage signal transmission circuit 4 is smaller than that of the initial stage signal transmission circuit 2, an internal inactivation signal, i.e., an internal initialization signal, is generated without fail for a certain period upon the application of power, and after the certain period passes, an internal activation signal is generated.

In the initial stage power on reset signal generation circuit 1, inversion power level is determined by the diode connected PMOS transistor 13 serving as an inversion potential deciding portion. As the PMOS transistor 13 is a single-stage P-channel type FET, it is possible for inversion to occur at a relatively low potential (when the threshold value of the PMOS transistor is 0.8V or so, the source voltage Vcc=0.8 to 1.0V) and, therefore, in the semiconductor integrated circuit adapted for low voltage operation, a lower limit of the operating source voltage may be set low, making it possible to achieve smaller power consumption.

As described above, since the output signal is inverted with a certain time lag immediately after application of power, it becomes possible to generate an internal circuit inactivation signal immediately after the application of power while generating an activation signal after the certain time passes. Further, since the initial stage power on reset signal generation circuit may invert the voltage level signal even at a low source potential, it is possible to obtain a device in which the lower limit of the operating source potential of the semiconductor integrated circuit is low and power consumption is small.

Figure 4:
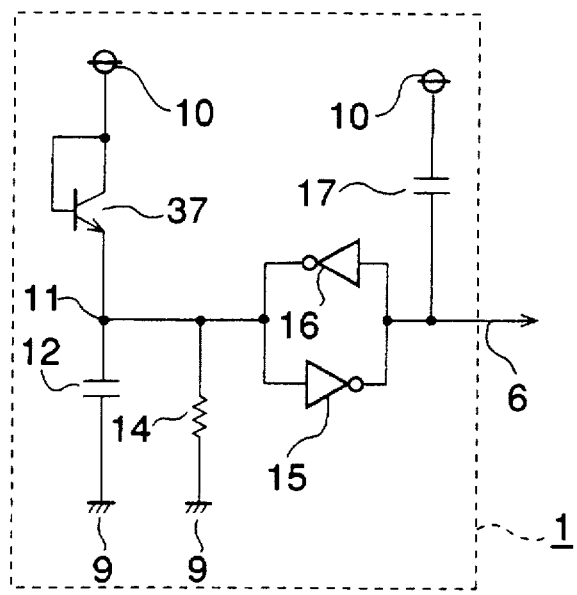
FIG. 4 is a circuit diagram showing a second embodiment of a reset signal generation circuit of the first embodiment of the invention.

Another embodiment of the initial stage power on reset signal generation circuit 1 of the circuit of the first embodiment is described. The inversion potential deciding portion of the initial stage power on reset signal generation circuit 1 may be also formed of a bipolar transistor 37, as shown in FIG. 4, instead of the diode connected PMOS transistor 13 shown in FIG. 3. In FIG. 4, the same reference numerals as the foregoing description designate the same or like parts. The bipolar transistor 37 may be not only a bipolar transistor produced by an accurate bipolar process, or BiCMOS process, but also a bipolar transistor produced by a CMOS process. In both cases, it is possible to obtain a device provided with a POR circuit having certain advantages.

Figure 5:
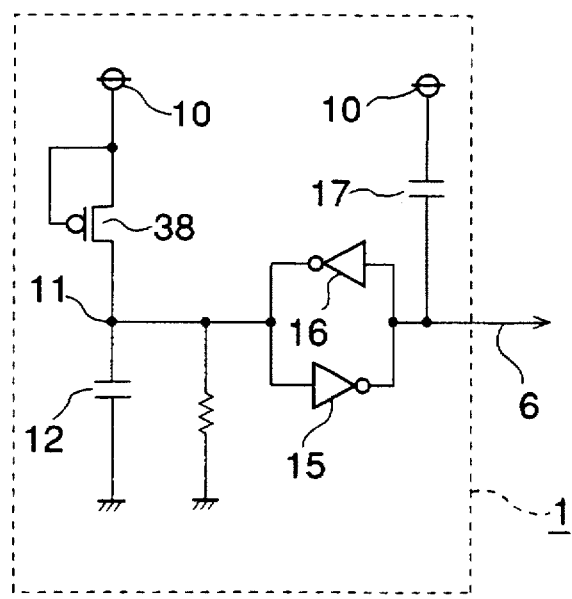
FIG. 5 is a circuit diagram showing a third embodiment of the reset signal generation circuit of the first embodiment of the invention.

It is further possible that, as shown in FIG. 5, the inversion potential deciding portion of the initial stage power on reset signal generation circuit 1 is formed of a NMOS transistor 38 in which source potential is applied to the gate electrode. In such an arrangement, the same advantages as the devices shown in FIGS. 3 and 4 are achieved.

Figure 6:
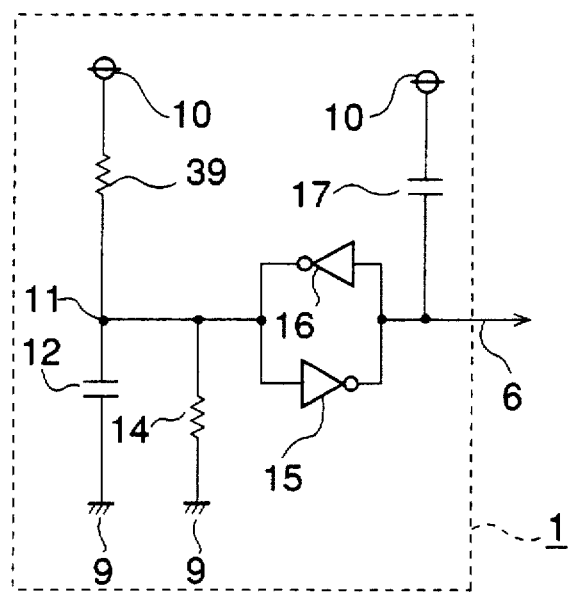
FIG. 6 is a circuit diagram showing a fourth embodiment of the reset signal generation circuit of the first embodiment of the invention.

It is further possible that, as shown in FIG. 6, the inversion potential deciding portion of the initial stage power on reset signal generation circuit 1 is formed of a resistor 39. In this arrangement, the same advantages as the devices shown in FIGS. 3, 4 and 5 are achieved also.

Since the initial stage power on reset signal generation circuit may invert at a low source potential, in the same manner as the device described in the first embodiment, with the inversion potential deciding portion shown in FIGS. 4, 5 and 6, a lower limit of the operating source potential may be low, making it possible to achieve small power consumption.

in a manner similar to that shown in FIGS. 4, 5 and 6, it is possible that the initial stage signal transmission circuit 2, the final stage power on reset signal generation circuit 3 and the final stage signal generation circuit 4, shown in FIG. 3, may be substituted with other devices having an equivalent function and a semiconductor integrated circuit device having the same advantages as the device of FIG. 3 may be obtained.

Figure 7:
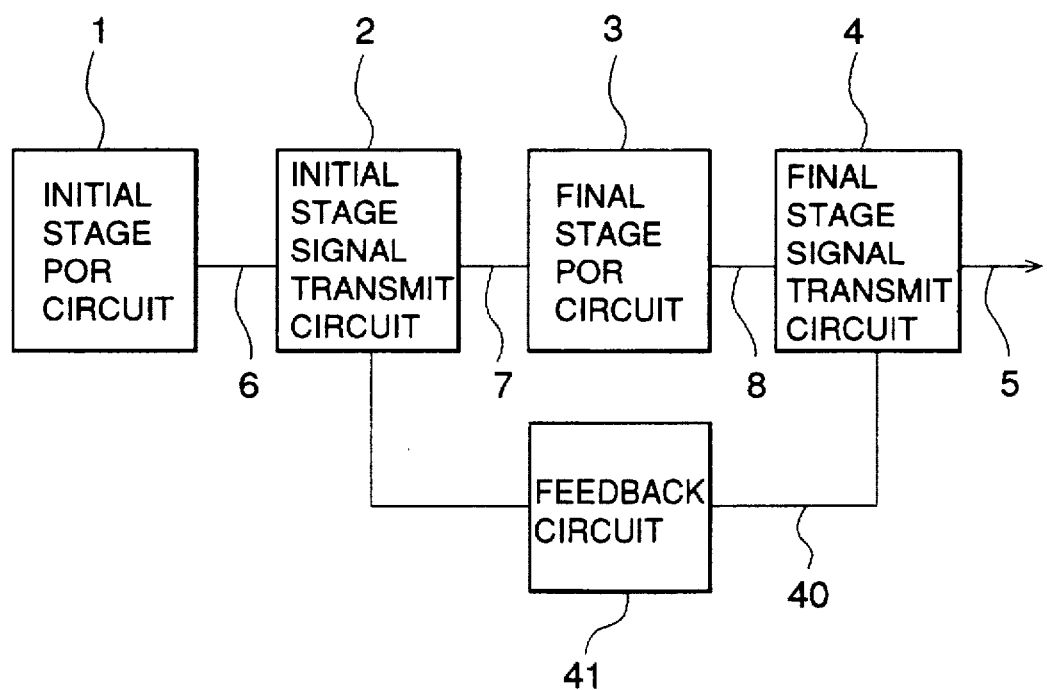
FIG. 7 is a block diagram showing a second embodiment of the invention.

A second embodiment of the invention is described with reference to FIG. 7. The power on reset signal generation circuit shown in FIG. 7 is structurally similar to that shown in FIG. 1, and the only difference is that a feedback node 40 is disposed therein. In FIG. 7, the same reference numerals as the foregoing description designate the same or like parts, and 41 is a feedback circuit connected to the feedback node 40. In this device, when operating the final stage signal transmission circuit 4, the feedback circuit 41 detects, through the feedback node 40, that the final stage signal transmission circuit 4 has operated, thereby making it possible to operate the initial stage signal transmission circuit 2. In this manner, as a result of adding the feedback function, an internal initialization signal is generated without fail and for a certain time, from the output signal 5.

Accordingly, the output signal is inverted immediately after application of power with a certain time delay, whereby an internal circuit inactivation signal is generated immediately after application of power, and an activation signal is generated after the certain time passes. As a result, it is possible to carry out initialization exactly irrespective of the rise time of the power source employed.

Since the initial stage power on reset signal generation circuit 1 may invert the voltage level signal at a low source potential in the same manner as hereinbefore described, the lower limit of the operating source potential of the semiconductor integrated circuit device may be low, making it possible to obtain a semiconductor integrated circuit device having small power consumption.

Figure 8:
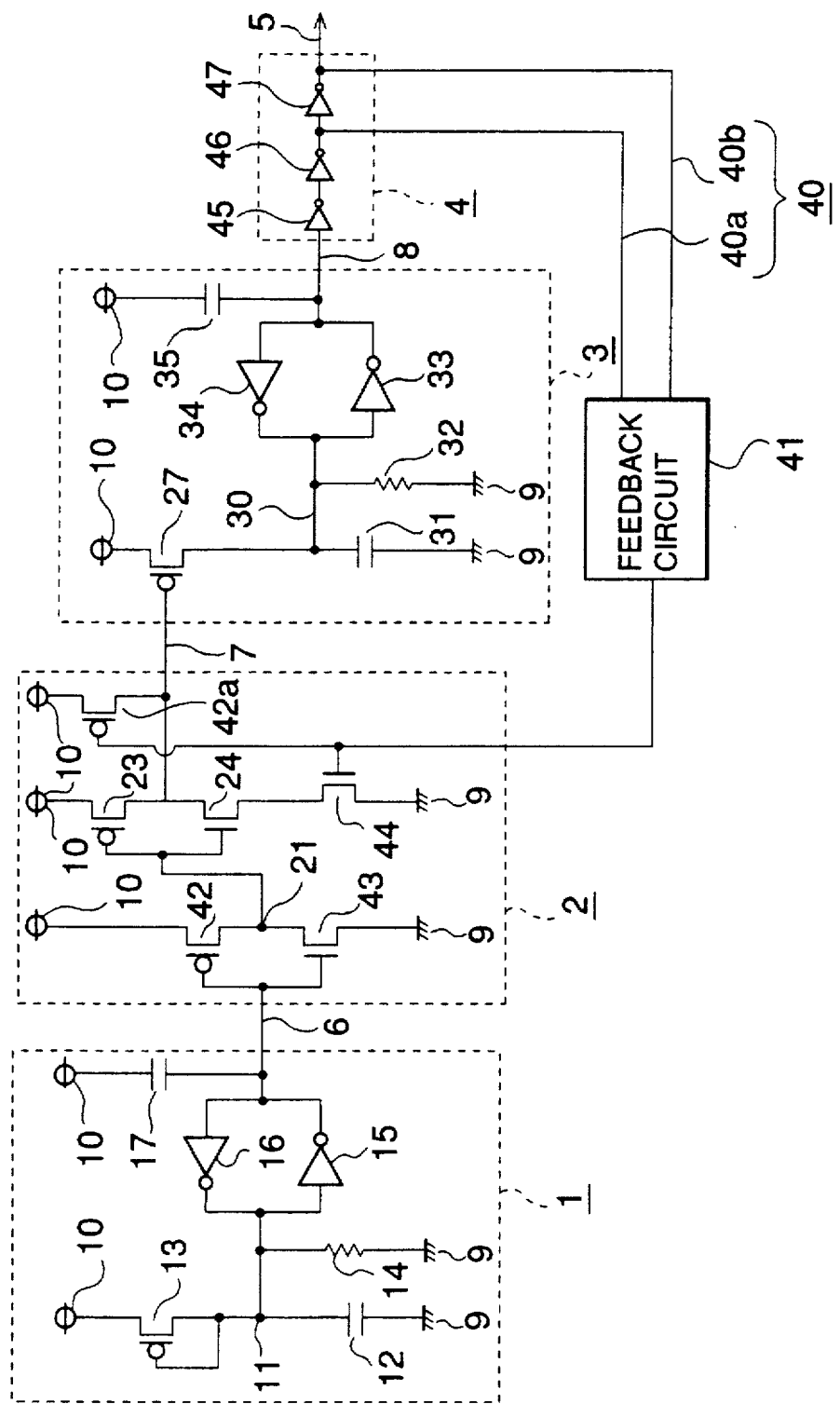
FIG. 8 is a circuit diagram showing the second embodiment of the invention.

In FIG. 8, the same reference numerals as the foregoing descriptions designate the same or like parts, and a specific arrangement of the circuit provided with the feedback node 40 and feedback circuit 41 is shown.

In FIG. 8, the initial stage power on reset signal generation circuit 1 has the same arrangement as the initial stage power on reset signal generation circuit 1 shown in FIG. 3, and the PMOS transistor 13, serving as an inversion potential deciding portion of this circuit 1, may be also formed with a bipolar transistor, a NMOS transistor, or a resistor.

The initial stage transmission circuit 2 inputs an output signal of the initial stage power on reset signal generation circuit 1 to a gate electrode common to a PMOS transistor 42 and a NMOS transistor 43 through the node 6, and the output is delivered from the source/drain electrode common to the transistors 42 and 43, through the node 21, to a gate electrode common to the PMOS transistor 23 and NMOS transistor 24. Further, a NMOS transistor 44 is formed between the GND side source/drain electrode of the NMOS transistor 24 and GND 9, and a potential is applied to the NMOS transistor 44 through the feedback node 40 and feedback circuit 41. Furthermore, a P-channel MOS transistor 42a is formed in which a source/drain electrode is connected to an output terminal common to the transistors 23, 24, another source/drain electrode is connected to the source potential 10, and an output from the feedback circuit 41 is applied to the gate electrode. The output of this initial stage signal transmission circuit 2 is delivered to the final stage power on reset signal generation circuit 3 from the source/drain electrode common to the transistors 23, 24 and from one source/drain electrode of the P-channel MOS transistor 42a through the node 7.

The output of the initial stage signal transmission circuit 2 is inputted to the final stage power on reset signal generation circuit then inputted, through the node 8, to the final stage signal transmission circuit 4 formed by connecting inverter circuits 45, 46, 47 in order. This output signal 5 becomes an input signal of a control system signal generation circuit of the semiconductor integrated circuit device such as a DRAM, SRAM, microprocessor, controller circuit, etc., at the next stage. The output signal of the inverters 46, 47 are inputted to the feedback circuit 41 through the feedback node 40 comprised of feedback nodes 40a and 40b, and the output of the feedback circuit 41 is applied to the gate electrodes of the NMOS transistor 44 and the PMOS transistor 42a of the initial stage power on reset signal generation circuit 2.

In the semiconductor device of this arrangement, the final stage signal transmission circuit 4 is operated normally, and when the signal level of the output of inverter circuits 46 and 47 attain a complementary state, an exclusive OR function is executed in the feedback circuit 41 and a high level signal is outputted to the gate electrodes of the NMOS transistor 44. As a result, the NMOS transistor 44 is activated and the initial stage signal transmission circuit 2 transmits the output signal of the initial stage power on reset signal generation circuit 1 to the final stage power on reset signal generation circuit 3. In this manner, as a result of forming the feedback node 40 and feedback circuit 41, an internal initialization signal may be exactly generated, and since the output signal may invert with a certain time lag immediately after application of power, an internal circuit inactivation signal may be generated immediately after the application of power, and an activation signal may be generated after the certain time passes. Further, since the initial stage power on reset signal generation circuit 1 may invert the voltage level signal even at a low source potential, the lower limit of the operating source potential of the semiconductor integrated circuit may be low, making it possible to obtain a semiconductor integrated circuit device having small power consumption.

The second embodiment of the invention with a second embodiment of the initial stage signal transmission circuit 2 is hereinafter described with reference to FIG. 9. The POR circuit of the semiconductor integrated circuit device shown in FIG. 9 performs basically the same functions as that shown in FIG. 8. In this circuit, the arrangement of the initial stage power on reset signal generation circuit 1, final stage power on reset signal generation circuit 3, final stage signal transmission circuit 4 and feedback circuit 41 is the same as that shown in FIG. 8. The initial stage signal transmission circuit 2 comprises a NMOS transistor 48a and a P-channel MOS transistor 48b. The NMOS transistor 48a, has source/drain electrodes connected to the nodes 6, 7, and the gate electrode receives the output of the feedback circuit 41. The gate electrode of P-channel MOS transistor 48b also receives the output signal of the feedback circuit 41, and the source/drain electrodes are connected to the source potential 10 and the node 7. With respect to the remaining parts, the same reference numerals as the foregoing description designate the same or like parts.

Figure 9:
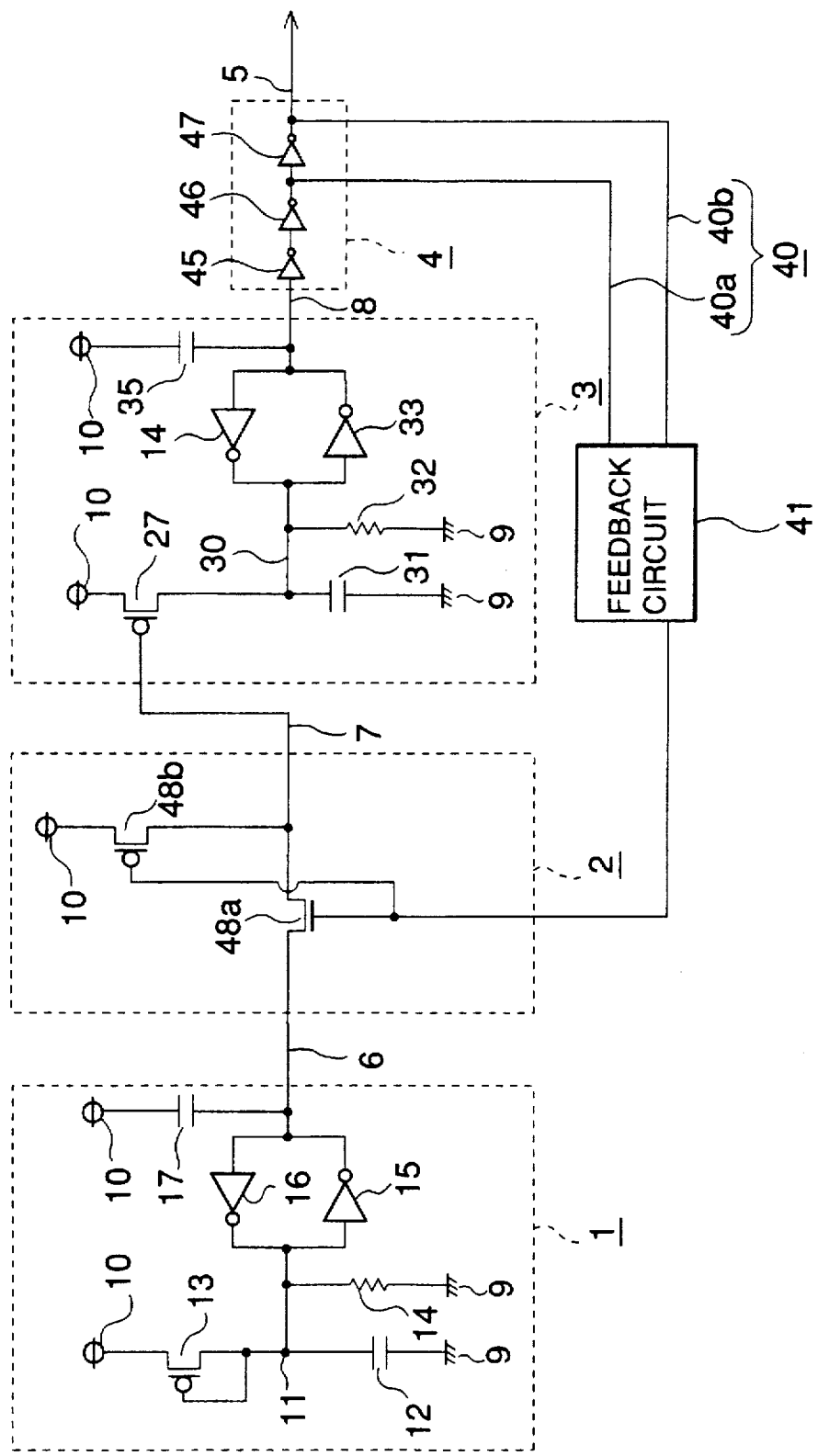
FIG. 9 is a circuit diagram showing the second embodiment of the invention with a second embodiment of an initial stage signal transmission circuit.

In the circuit shown in FIG. 9, the final stage signal transmission circuit 4 is normally operated, and when the signal level of the output of the inverter circuits 46 and 47 attain a complementary state, the complementary signals are transmitted to the feedback circuit 41 through the feedback nodes 40a, 40b, an exclusive OR is executed in the feedback circuit 41 and a high level signal is outputted. At this same time, the NMOS transistor 48a of the initial stage signal transmission circuit 2 is activated and the output signal of the initial stage power on reset signal generation circuit 1 is transmitted to the final stage power on reset signal generation circuit 3 with a predetermined time lag after application of power. As a result, it is possible to exactly generate an internal initialization signal during the period from the application of power to the activation of the initial stage signal transmission circuit 2.

Further, since the initial stage power on reset signal generation circuit may invert the voltage level signal even at a low source potential, the lower limit of the operating source potential of the semiconductor integrated circuit may be low, making it possible to obtain a semiconductor integrated circuit device having small power consumption.

Figure 10:
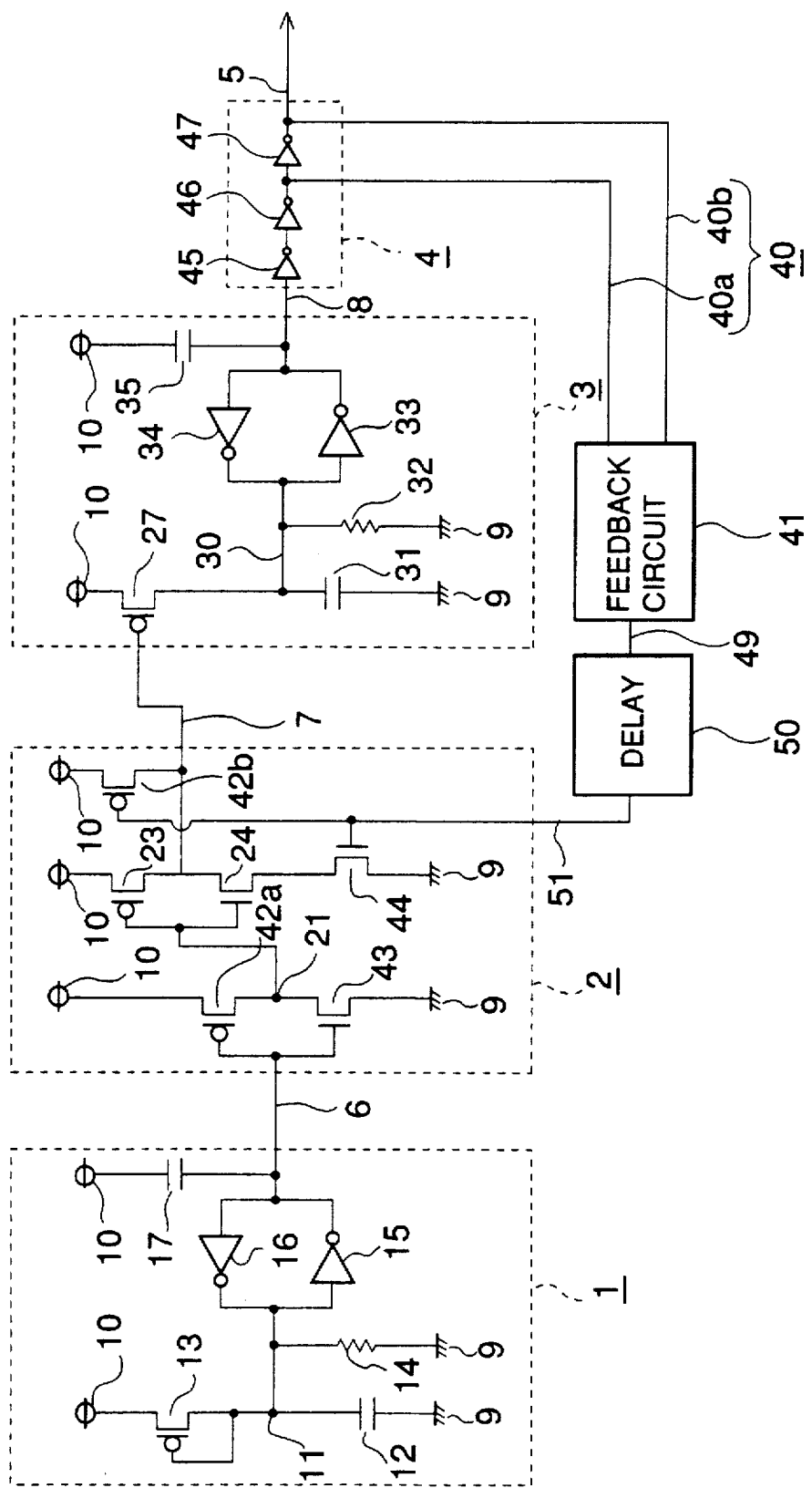
FIG. 10 is a circuit diagram showing a modification of the second embodiment of the invention.

A modification of the second embodiment of the invention shown in FIG. 8 is described with reference to FIG. 10. FIG. 10 shows a circuit similar to the circuit shown in FIG. 8, but with a delay circuit 50. Delay circuit 50 is connected to the feedback circuit 40 through a node 49 for transmitting the output signal of the feedback circuit 41 to the delay circuit 50, and another node 51 for transmitting the output signal of the delay circuit 50 to the initial stage signal transmission circuit 2. With respect to the remaining parts, the same reference numerals as the foregoing description designate the same or like parts.

In the circuit shown in FIG. 10, the final stage signal transmission circuit 4 is operated normally after application of power, and when the signal level of the output of the inverter circuits 46 and 47 attain a complementary state, the complementary signals are transmitted to the feedback circuit 41, an exclusive OR function is executed in the feedback circuit 41 and a high level signal is outputted. When the signal transmitted to the node 49 becomes a high level, the signal is transmitted to the initial stage signal transmission circuit 2 through the delay circuit 50 after passing a predetermined delay time, whereby the NMOS transistor 44 is activated, and the output signal of the initial stage power on reset signal generation circuit 1 is transmitted to the final stage power on reset signal generation circuit 3. As a result, it is possible to generate an internal initialization signal exactly during the period from the application of power to the activation of the initial stage signal transmission circuit 2.

Although the delay circuit 50 is formed between the feedback circuit 41 and the initial stage power on reset signal generation circuit 2 in FIG. 10, it is also possible for the delay circuit 50 to be connected to the feedback nodes 40a, 40b and located between the feedback circuit 41 and the final stage signal transmission circuit 4.

Further, in the arrangement shown in FIG. 10, since the delay circuit 50 is formed in a next stage of the feedback circuit, any delay time may be freely established.

Furthermore, since the initial stage power on reset signal generation circuit may invert the voltage level signal am a low source potential, the lower limit of the operating source potential of the semiconductor integrated circuit may be low, making it possible to obtain a semiconductor integrated circuit device having small power consumption.

Figure 11:
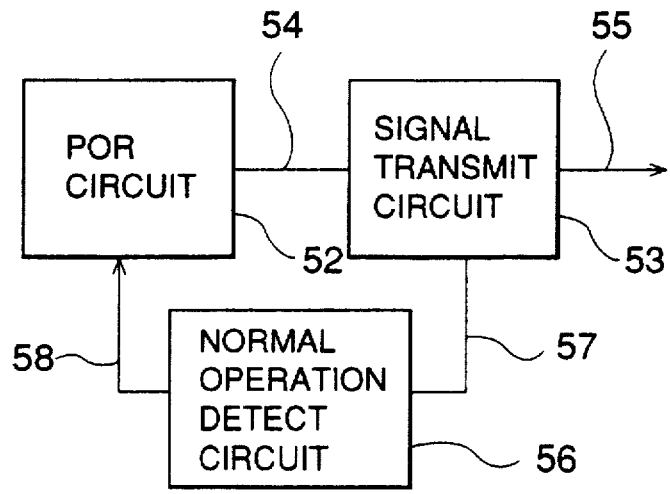
FIG. 11 is a block diagram showing a third embodiment of the invention.

FIG. 11 is a circuit diagram showing a third embodiment of the invention in which 52 is a power on reset signal generation circuit, 53 is a signal transmission circuit, 54 is a node for connecting the power on reset signal generation circuit 52 to the signal transmission circuit 53, and 55 is a node for connecting the signal transmission circuit 53 to a control system signal generation circuit of the semiconductor integrated circuit device such as a DRAM, SRAM, microprocessor, controller, etc., formed at a next stage. 56 is a normal operation detecting circuit for detecting the operation state of the signal transmission circuit 53, 57 is a node for electrically connecting the signal transmission circuit 53 to the normal operation detecting circuit 56, and 58 is a node for electrically connecting the normal operation detecting circuit 56 to the power on reset signal generation circuit 52.

In this circuit, the power on reset signal generation circuit 52 maintains an initial voltage value, and when applying a source voltage, a value thereof is transmitted to the signal transmission circuit 53. As a result of normal operation of the signal transmission circuit 53, the normal operation detecting circuit 55 generates an activation signal, and this activation signal is transmitted to the power on reset signal generation circuit 52 and an internal activation signal is generated from the power on reset signal generation circuit 52.

As a result of the above described circuit, the level of the output signal is inverted with a predetermined time lag after application of power, an internal circuit inactivation signal may be generated immediately after the application of power and an activation signal may be generated after a certain period, whereby internal initialization may be exactly performed.

Further, since the power on reset signal generation circuit 52 may invert the voltage level signal even at a low source potential, it is possible to obtain a device in which the lower limit of the operating source potential of the semiconductor integrated circuit is low and power consumption is small.

Figure 12:
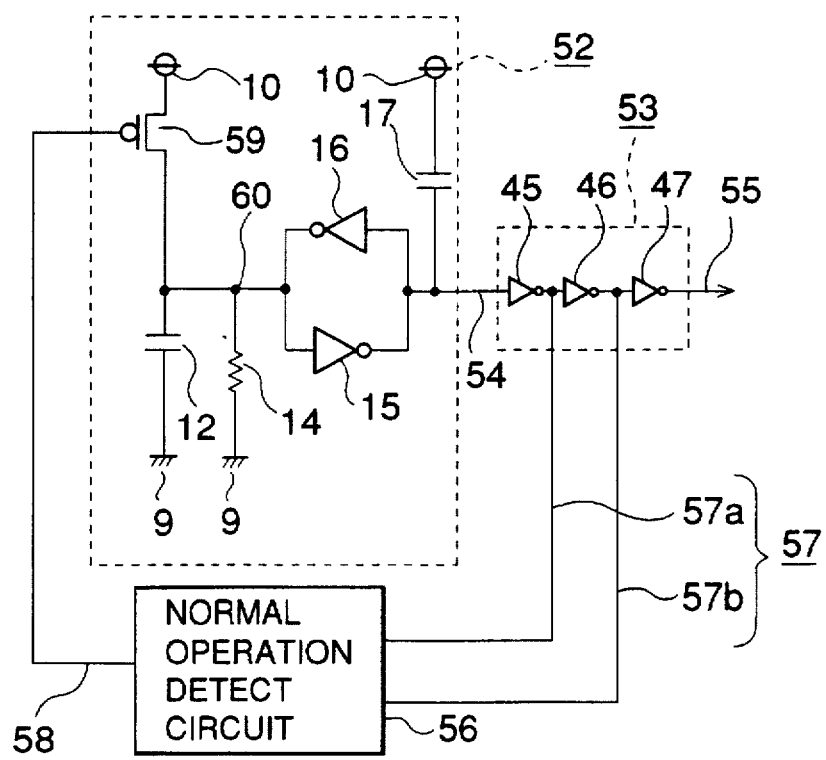
FIG. 12 is a circuit diagram showing the third embodiment of the invention.

FIG. 12 is a circuit diagram showing the circuit of FIG. 11. In FIG. 12, the arrangement of the power on reset signal generation circuit 52 is similar to the initial stage power on reset signal generation circuit 1 of FIG. 3 and a potential is fed back from the signal transmission circuit 53 through the normal operation detection circuit 56 and applied to the gate electrode of the PMOS transistor 59 replacing the diode connected PMOS transistor 13 of the initial stage power on rest signal generation circuit 1. PMOS transistor 59 has one source/drain electrode connected to the power source 10 and another source/drain electrode connected to a node 60.

A signal transmission circuit 53 is formed as a next stage and connected through a node 54 to the power on reset signal generation circuit 52. The arrangement of the signal transmission circuit 53 is the same as the final stage signal transmission circuit 4 shown in FIG. 8. The output signal of the inverters 45 and 46 are inputted to the normal operation detecting circuit 56 through the node 57 comprised of nodes 57a and 57b. The output signal of the normal operation detecting circuit 56 is applied to the gate electrode of a PMOS transistor 59 in the power on reset signal generation circuit 52 through the node 58.

In the POR circuit of the above arrangement, the node 60 remains at a low level at the moment of application of power, and the PMOS transistor 59 is in an inactivated state. The output signal of the POR circuit remains at a low level for a certain time. The signal transmission circuit 53 then operates normally, an exclusive OR of the signal outputted through the nodes 57a and 57b is executed by the normal operation detecting circuit 56 from the complementary signals provided from the signal transmission circuit 53, and a low level signal is output. The potential is transmitted through the node 58 and the PMOS transistor 59 of the power on rest signal generation circuit 52 is activated, whereby the node 60 rises to a high level. As a result, a high level signal is output as the output signal 55.

In the semiconductor integrated circuit device provided with the circuit arranged above, since the output signal may invert with a certain time lag after application of power, it is possible to generate an internal circuit inactivation signal, i.e., internal initialization signal immediately after application of power, and to generate an activation signal after passing the certain time. As a result, it is possible to exactly establish a certain internal initialization time.

Furthermore, since the power on reset signal generation circuit 52 may invert the voltage level signal even at a low source potential, it is possible to obtain a semiconductor integrated circuit device having small power consumption.

Figure 13:
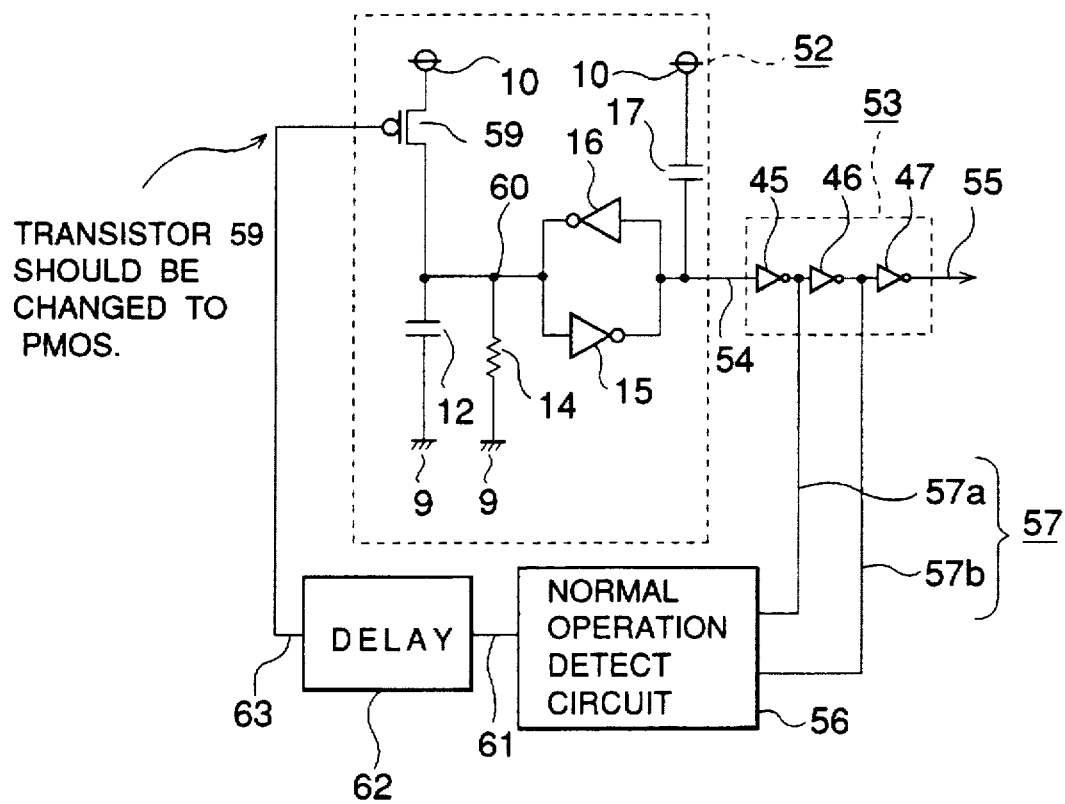
FIG. 13 is a circuit diagram showing a modification of the third embodiment of the invention.
Figure 14:
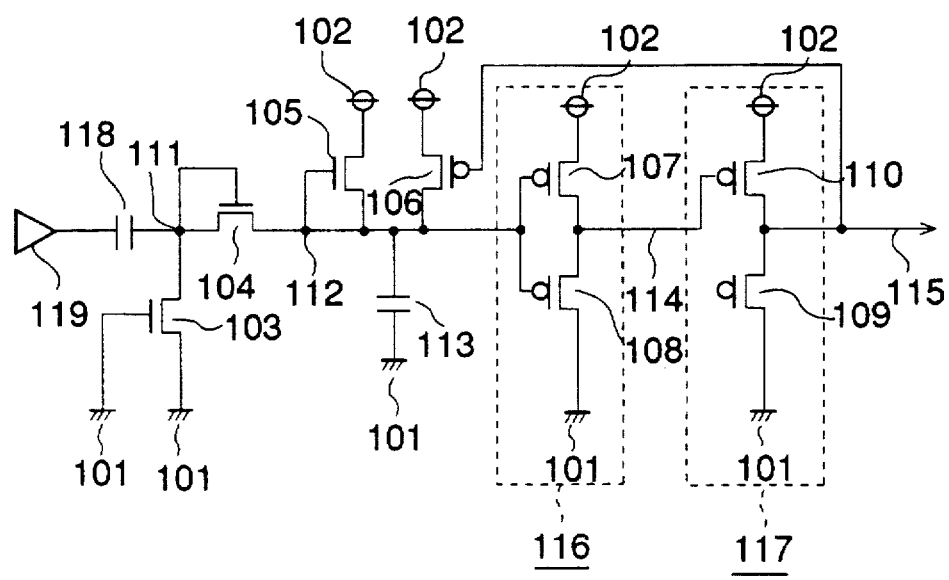
FIG. 14 is a circuit diagram showing a prior art POR circuit.
Figure 15:
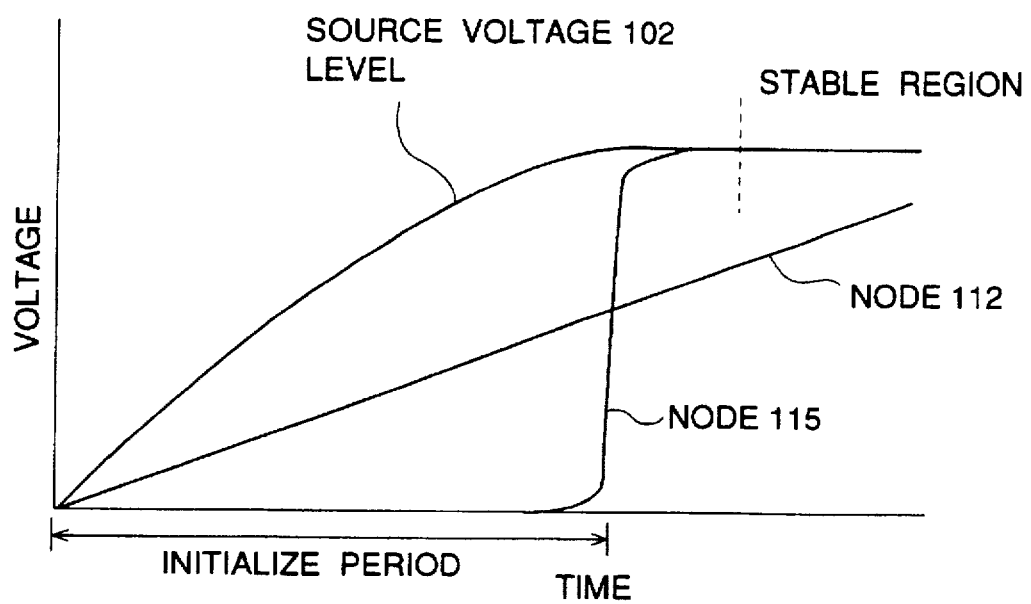
FIG. 15 is a wave form diagram of the prior art POR circuit.

FIG. 13 is a circuit diagram showing a modification of the circuit of FIG. 12. In FIG. 13, a delay circuit 62 is connected through a node 61 to the normal operation detecting circuit 56 and the output signal of the delay circuit 62 is applied to the gate electrode of the PMOS transistor 59 in the power on reset signal generation circuit 52 through a node 63. As for the remaining parts, the same reference numerals as in the foregoing description designate the same or like parts. The delay circuit 62 performs the same function as that of the delay circuit 50, shown in FIG. 10. Operation of the circuit shown in FIG. 13 is described. First, the node 60 remains at a low level at the moment of application of power and PMOS transistor 59 is in an inactivated state. Then, the output signal of the POR circuit is at a low level for a certain time. The signal transmission circuit 53 is then operated normally and an exclusive OR of the signals outputted through the nodes 57a and 57b from the signal transmission circuit 53 is executed by the normal operation detecting circuit 56, thereby a low level is output. The output of the normal operation detecting circuit 56 is transmitted to the delay circuit 62 through the node 61 and, in the delay circuit 62, the output signal of the normal operation detecting circuit 56 is transmitted to the gate electrode of the PMOS transistor 59 of the power on reset signal 52 through the node 63 after the passage of a freely established certain time. The moment when the low level potential signal is received by the gate electrode, the PMOS transistor 59 is activated whereby, the node 60 rises to a high level. As a result, a high level signal is output as the output signal 55.

In the semiconductor integrated circuit device provided with the circuit arranged above, since the output signal may invert with a certain time lag after application of power, it is possible to generate an internal circuit inactivation signal, i.e., internal initialization signal, immediately after application of power, and to generate an activation signal after the certain time passes. As a result, it is possible to exactly establish a certain internal initialization time. Furthermore, as a result of forming the delay circuit 62, it is now possible to establish freely a delay time and to adjust the internal initialization time. Thus, it is possible to achieve a semiconductor integrated circuit device having superior controllability.

Although the delay circuit 62 is formed between the feedback circuit 56 and the power on reset signal generation circuit 52 in the power on reset signal generation circuit shown in FIG. 13, it is also possible to adjust the internal circuit initialization timing by connecting the delay circuit 62 between the normal operation detecting circuit 56 and the signal transmission circuit 53 so that a complementary signal may be transmitted to the normal operation detecting circuit 56 with a predetermined time lag.

Moreover, since the power on reset signal generation circuit 52 may invert the voltage level signal even at a low source potential, it is possible to arrange a semiconductor integrated circuit device having smaller power consumption.

The many features and advantages of the invention are apparent from the detailed specification, and thus, it is intended by the appended claims to cover all such features and advantages of the invention which fall within the true spirit and scope of the invention. Since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor integrated circuit device having an internal circuit node reset signal generation circuit for inverting an output signal with a predetermined time lag immediately after application of power, said internal circuit node reset generation circuit comprising:

an initial stage power on reset signal generation circuit;

an initial stage signal transmission circuit for inputting a signal outputted by said initial stage power on reset signal generation circuit;

a final stage power on reset signal generation circuit for inputting a signal outputted by said initial stage signal transmission circuit; and a final stage signal transmission circuit for inputting a signal outputted by said power on reset signal and outputting the output signal;

wherein an operating source voltage lower limit value of said initial stage signal transmission circuit is higher than that of said final stage signal transmission circuit.

2. The semiconductor integrated circuit device as set forth in claim 1, wherein said final stage power on reset signal generation circuit keeps an initial voltage value and immediately after application of power, said initial voltage value is transmitted to said final stage signal transmission circuit.

3. The semiconductor integrated circuit device as set forth in claim 1, wherein
   a) when a source voltage value has not reached a predetermined value immediately after application of power,
      i) said final stage signal transmission circuit operates,
      ii) said initial stage signal transmission circuit does not operate, and
      iii) said final stage power on reset signal generation circuit operates without being influenced by said initial stage power on reset signal generation circuit, and
   b) when the source voltage value has exceeded the predetermined value, the output signal of said initial stage power on reset signal generation circuit is transmitted to said final stage power on reset signal generation circuit.

4. The semiconductor integrated circuit device as set forth in claim 1, wherein said initial stage power reset on signal generation circuit includes an inversion potential deciding part comprising on of a PMOS transistor, a NMOS transistor, a bipolar transistor and a resistor element.

5. A semiconductor integrated circuit device comprising:
   an internal circuit node reset signal generation circuit including
   an initial stage power on reset signal generation circuit for inverting an output signal with a predetermined time lag immediately after application of power,
   an initial stage signal transmission circuit for inputting a signal outputted by said initial stage power on reset signal generation circuit,
   a final stage power on reset signal generation circuit for inputting a signal outputted by said initial stage signal transmission circuit, and
   a final stage signal transmission circuit for inputting a signal outputted by said final stage power on reset signal generation circuit and outputting an output signal; and
   a feedback circuit for inputting a signal corresponding to said output signal and a signal complementary to said output signal from said final stage signal transmission circuit, and outputting a signal which is an exclusive OR function of the input signals to said initial stage signal transmission circuit.

6. The semiconductor integrated circuit device as set forth in claim 5, further comprising a delay circuit connected between said feedback circuit and said internal circuit node reset signal generation circuit.

7. A semiconductor integrated circuit device having an internal circuit node reset signal generation circuit comprising:
   a power on reset signal generation circuit;
   a signal transmission circuit; and
   a normal operation detecting circuit,
wherein
   said power on reset signal generation circuit generates a first level signal for a prescribed time, and thereafter in response to a control signal generates a second level signal,
   said signal transmission circuit generates an output signal and complementary signals based on said first and second level signals, and
   said normal operation detecting circuit detects an expiration of said prescribed time based on said complementary signals, and generates said control signal.

8. The semiconductor integrated circuit device as set forth in claim 7, further comprising a delay circuit connected between said normal operation detecting circuit and said power on reset signal generation circuit.

* * * * *